US012813296B2

(12) United States Patent
Sapozhnikov et al.

(10) Patent No.: US 12,813,296 B2
(45) Date of Patent: Nov. 24, 2026

(54) PACKAGE ASSEMBLY FOR INTEGRATED CIRCUIT

(71) Applicant: Cisco Technology, Inc., San Jose, CA (US)

(72) Inventors: Mike Sapozhnikov, San Jose, CA (US); Amendra Koul, San Francisco, CA (US); David Nozadze, San Jose, CA (US); Joel Richard Goergen, Soulsbyville, CA (US); Sayed Ashraf Mamun, San Jose, CA (US); Srinath Penugonda, Milpitas, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 457 days.

(21) Appl. No.: 18/453,720

(22) Filed: Aug. 22, 2023

(65) Prior Publication Data

US 2025/0029931 A1 Jan. 23, 2025

Related U.S. Application Data

(60) Provisional application No. 63/514,628, filed on Jul. 20, 2023.

(51) Int. Cl.
*H10W 70/63* (2026.01)
*H10W 20/42* (2026.01)
(Continued)

(52) U.S. Cl.
CPC ......... *H10W 70/635* (2026.01); *H10W 20/42* (2026.01); *H10W 70/611* (2026.01);
(Continued)

(58) Field of Classification Search
CPC ............. H10W 70/611; H10W 70/635; H10W 70/62–668; H10W 72/931; H10W 72/932; H10W 90/20–297; H10W 90/794; H10W 90/22; H10W 90/732; H10W 90/734; H10W 20/435; H10W 20/211; H10W 20/212; H10W 20/2125; H10W 20/222
See application file for complete search history.

(56) References Cited

U.S. PATENT DOCUMENTS 8,119,931 B1 * 2/2012 Liu ...................... H05K 1/0222 174/262
9,230,900 B1 * 1/2016 Qian ................... H10W 70/635
(Continued)

OTHER PUBLICATIONS

Wang et al., "Optimized dielectric performance in bismaleimide—triazine resin via a dual-modification strategy for high-frequency electronic packaging", Journal of Materials Chemistry C, 13, 14943, 2025. (Year: 2025).*
(Continued)

*Primary Examiner* — Scott B Geyer
(74) *Attorney, Agent, or Firm* — Edell, Shapiro & Finnan, LLC

(57) ABSTRACT

In some embodiments, an integrated circuit (IC) includes multiple packages that are separate from one another. Each package includes a pad, and a core via is electrically coupled to the pads of the separate packages to electrically couple the packages to one another. At least one of the pads includes an oblong shape to match its impedance with the impedance of the core via.

20 Claims, 8 Drawing Sheets

(51) Int. Cl.

| | |
|---|---|
| ***H10W 70/60*** | (2026.01) |
| ***H10W 72/90*** | (2026.01) |
| ***H10W 80/00*** | (2026.01) |
| ***H10W 90/00*** | (2026.01) |

(52) U.S. Cl.

CPC .......... *H10W 90/00* (2026.01); *H10W 72/932* (2026.01); *H10W 80/312* (2026.01); *H10W 90/794* (2026.01)

(56) References Cited

U.S. PATENT DOCUMENTS

| | | | | |
|---|---|---|---|---|
| 2010/0096725 | A1* | 4/2010 | Shi | H10W 70/65 257/E23.023 |
| 2011/0003435 | A1 | 1/2011 | Tang et al. | |
| 2011/0074041 | A1* | 3/2011 | Leung | H10W 70/60 257/E21.585 |
| 2014/0001643 | A1* | 1/2014 | Kong | H10W 20/42 257/E23.06 |
| 2014/0264907 | A1* | 9/2014 | Altunyurt | H10W 20/42 257/774 |
| 2015/0194378 | A1 | 7/2015 | Tsang | |
| 2016/0181189 | A1* | 6/2016 | Qian | H10W 70/635 174/264 |
| 2018/0286797 | A1* | 10/2018 | Goh | H10W 44/20 |
| 2019/0131257 | A1* | 5/2019 | Kong | H10W 20/49 |
| 2019/0295966 | A1* | 9/2019 | Kong | H10W 44/00 |
| 2020/0013710 | A1 | 1/2020 | Liu et al. | |
| 2020/0211986 | A1* | 7/2020 | Curtis | H10W 44/20 |
| 2020/0303330 | A1* | 9/2020 | Lin | H10W 44/20 |
| 2021/0351116 | A1 | 11/2021 | Ganesan et al. | |
| 2021/0375798 | A1* | 12/2021 | Ma | H10W 44/20 |
| 2022/0013444 | A1* | 1/2022 | Kim | H10W 70/685 |
| 2022/0310503 | A1 | 9/2022 | Hsu et al. | |
| 2023/0127676 | A1* | 4/2023 | Park | H10W 44/20 257/245 |
| 2023/0317588 | A1* | 10/2023 | Sun | H10W 44/20 |
| 2023/0352387 | A1* | 11/2023 | Jiang | H10P 74/203 |
| 2024/0136270 | A1* | 4/2024 | Preda | H10W 70/65 |

OTHER PUBLICATIONS

Vardapetyan, et al., "Via Design Optimization for High Speed Differential Interconnects on Circuit Boards," 2020 IEEE 29th Conference on Electrical Performance of Electronic Packaging and Systems (EPEPS), Oct. 2020, 3 Pages.

* cited by examiner

PACKAGE ASSEMBLY FOR INTEGRATED CIRCUIT

CROSS-REFERENCE TO RELATED APPLICATION

This application claims priority to and the benefit of U.S. Provisional Patent Application No. 63/514,628, entitled "PACKAGE ASSEMBLY FOR INTEGRATED CIRCUIT," filed Jul. 20, 2023, which is hereby incorporated by reference in its entirety for all purposes.

TECHNICAL FIELD

The present disclosure relates to integrated circuits (ICs) and packages of ICs.

BACKGROUND

An integrated circuit (IC), such as an application-specific integrated circuit (ASIC), includes a variety of components that communicate with one another via signal transmission during operation of the IC. The IC may include multiple packages that are stacked and combined with or coupled to one another. For example, an IC includes a logic package that includes components configured to generate, transmit, receive, and/or process signals, as well as a ball grid array (BGA) package configured to couple to another electrical component, such as a printed circuit board (PCB), separate from the IC, to enable signal transmission between the IC and the other electrical component.

Microvias may electrically couple components of different layers within a package of an IC to one another, and core vias may couple separate packages to one another. For example, a signal may be transmitted from a first trace of a first layer of a first package to a second trace of a second layer of the first package by way of a microvia extending from the first layer to the second layer, and then from the second trace of the second layer of the first package to a trace of a layer of the second package by way of a core via extending from the first package to the second package. Unfortunately, impedance discontinuities between any of the components along which the signal travels may negatively affect integrity of signal transmission. For example, a sudden change in impedance can cause resonances and result in signal loss, thereby limiting or reducing effective operation of the IC.

DETAILED DESCRIPTION

Overview

The present disclosure is directed to an integrated circuit (IC). In some aspects, the techniques described herein relate to an apparatus, including: a plurality of packages of an integrated circuit (IC); a core via extending between a first package of the plurality of packages and a second package of the plurality of packages; and a pad electrically coupling the core via to the first package, wherein the pad includes an oblong shape.

In some aspects, the techniques described herein relate to a method, including: positioning a core via between a first package of an integrated circuit (IC) and a second package of the IC; and electrically coupling the core via to an oblong pad of the first package to electrically couple the core via to the first package.

In some aspects, the techniques described herein relate to an apparatus, including: a first pad of a first package of an integrated circuit (IC); a second pad of a second package of the IC; and a core via having a first end connected to the first pad and a second end connected to the second pad to electrically couple to the first package and to the second package, wherein at least one of the first pad and the second pad is oblong.

Example Embodiments

Figure 1:
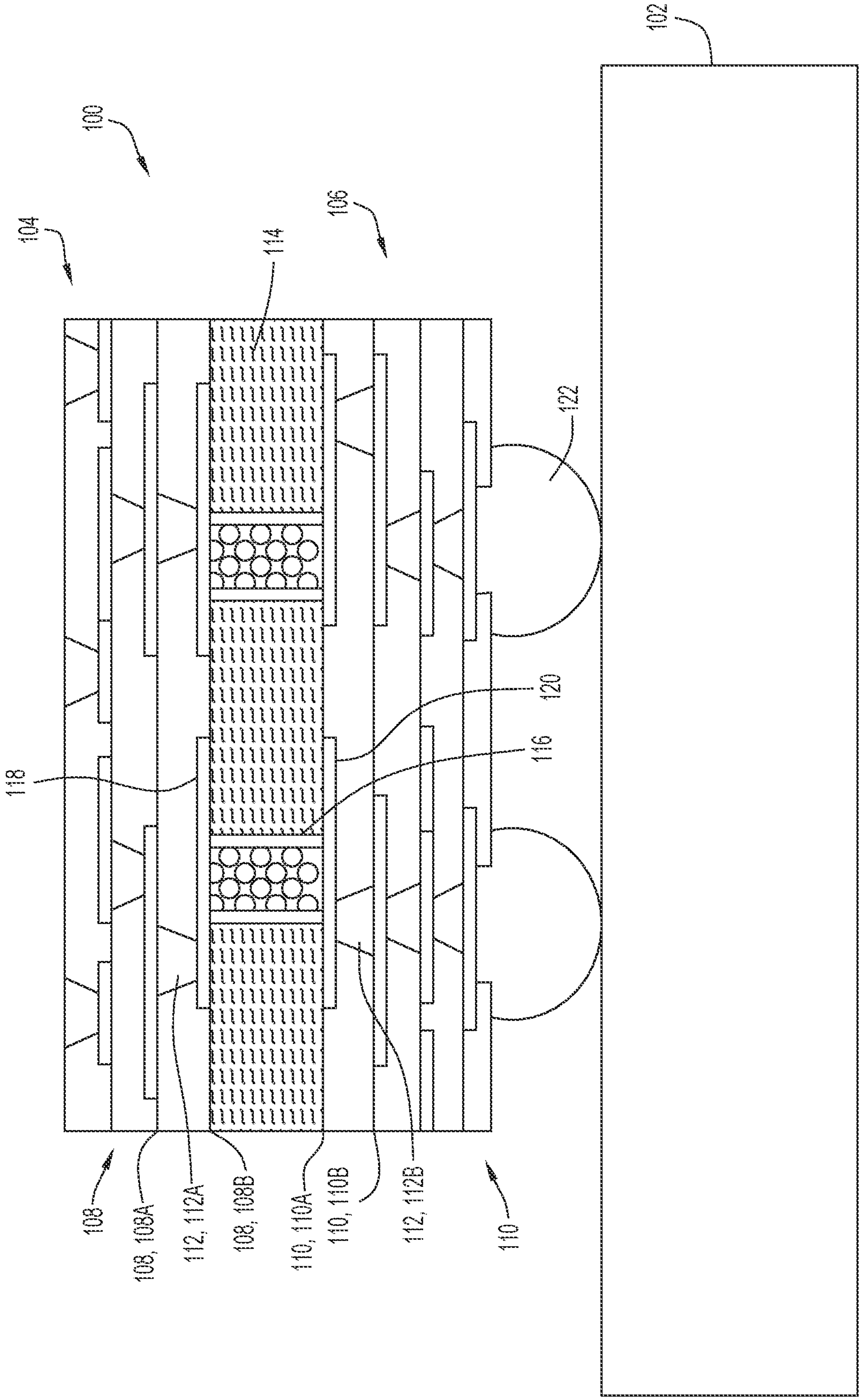
FIG. 1 is a perspective cross-sectional view of an integrated circuit (IC) coupled to a printed circuit board (PCB), according to an example embodiment.

With reference made to FIG. 1, depicted therein is a cross-sectional view of an embodiment of an IC 100 coupled to a PCB 102. The IC 100 may include multiple packages that are electrically coupled to one another. For example, the IC 100 may include a first package 104 and a second package 106. The first package 104 may include a first plurality of layers 108, and the second package 106 may include a second plurality of layers 110. Microvias 112 electrically couple components within each individual package 104, 106. To this end, a microvia 112 may extend between the first plurality of layers 108 or between the second plurality of layers 110. For example, a first microvia 112A may extend between a first layer 108A and a second layer 108B of the first plurality of layers 108. Thus, the first microvia 112A may electrically couple a component at the first layer 108A with a component at the second layer 108B. Similarly, a second microvia 112B may extend between a third layer 110A and a fourth layer 110B of the second plurality of layers 110. As such, the second microvia 112B may electrically couple a component at the third layer 110A with a component at the fourth layer 110B.

However, although the microvias 112 may electrically couple components within each individual package 104, 106, the microvias 112 may not electrically couple components located at different packages 104, 106. For example, the packages 104, 106 may be offset from one another to form a core region 114 therebetween. The microvias 112 may not extend into the core region 114. Therefore, each microvia 112 may be contained within a single one of the packages 104, 106. Instead, core vias 116 extend within the core region 114 and between the packages 104, 106 to electrically couple the packages 104, 106 to one another.

By way of example, one of the core vias 116 is electrically coupled to the first microvia 112A and to the second microvia 112B. For instance, the first microvia 112A may be connected to a first pad 118 at the second layer 108B of the first package 104, and the core via 116 may be connected to the first pad 118 at the second layer 108B (e.g., the first pad 118 may be exposed to the core region 114). Thus, the first pad 118 may electrically couple the first microvia 112A and the core via 116 to one another. Additionally, the second microvia 112B may be connected to a second pad 120 at the third layer 110A, and the core via 116 may be connected to the second pad 120 at the third layer 110A (e.g., the second pad 120 may be exposed to the core region 114). Therefore, the second pad 120 may electrically couple the second microvia 112B and the core via 116 to one another. For example, a signal may be transmitted along the first microvia 112A, along the first pad 118, along the core via 116, along the second pad 120, and along the second microvia 112B to transmit between the packages 104, 106.

However, discontinuities in a certain electrical property between the components along which the signal travels may affect signal transmission. For example, a sudden change in the impedance of the components may cause excessive signal loss, thereby reducing signal integrity. Consequently, operation of the IC 100 effectuated by signal propagation may be reduced or limited. For this reason, the components of the IC 100 may be manufactured or otherwise configured to limit impedance discontinuities, such as by reducing sudden changes in impedance. In other words, the impedance may gradually vary between the components of the IC 100. As an example, the core region 114 may be relatively large (e.g., 1400 micrometers or more) to enable increased package sizes for higher data rate transmissions (e.g., 224 gigabytes per second (Gbps) having an associated fundamental frequency of 56 gigahertz (GHz)), and the core via 116 may be manufactured to accommodate extension through the large core region 114. Such manufacture of the core via 116 may cause the core via 116 to have substantial capacitance and therefore relatively lower impedance, which may cause more reflections and/or resonances. The first pad 118 and/or the second pad 120 may have an oblong shape that causes the respective impedances to match or be sufficiently similar to (e.g., within a threshold of) that of the core via 116. The reduced impedance discontinuity between the core via 116, the first pad 118, and the second pad 120 may reduce resonance (e.g., scattering parameter resonance) and reflection to improve signal integrity. That is, signal loss is reduced, and a signal is better transmitted between the packages 104, 106. As a result, operation of the IC 100 may be improved.

In the illustrated embodiment, the second package 106 is coupled to the PCB 102 by way of interconnects 122 (e.g., solder balls). For example, the second package 106 may include a ball grid array (BGA) package configured to enable signal transmission between the IC 100 and the PCB 102 by way of the interconnects 122, and the first package 104 may include a logic package configured to generate, transmit, receive, and/or process signals (e.g., a signal to be transmitted to the PCB 102, a signal received from the PCB 102). However, in additional or alternative embodiments, the techniques discussed herein, such as oblong pad configurations, may be implemented in any other suitable types of packages.

Figure 2:
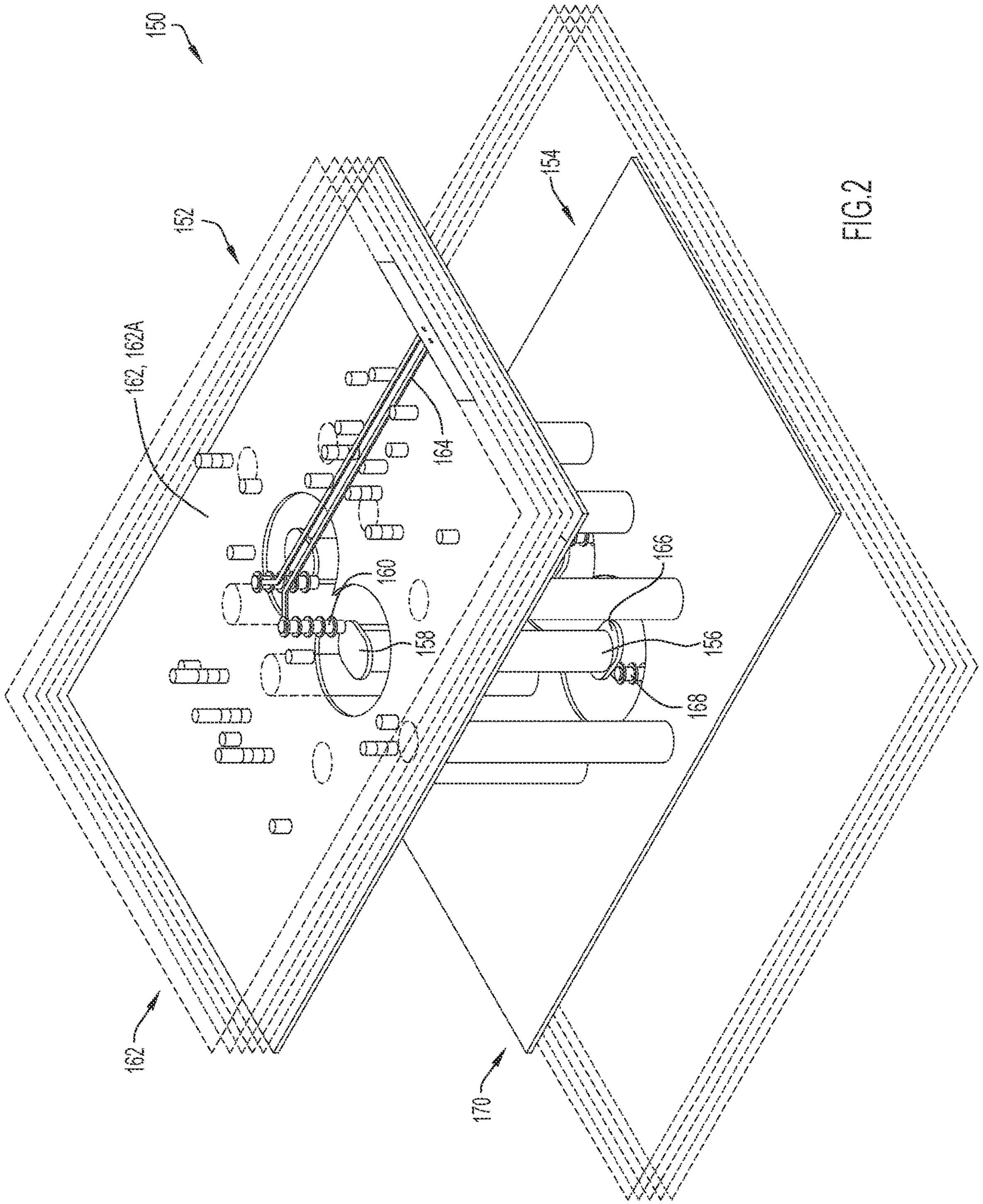
FIG. 2 is a perspective view of an IC with oblong pads, according to an example embodiment.

FIG. 2 is a perspective view of an embodiment of an IC 150 with a first package 152 and a second package 154. Certain components of the IC 150, such as portions of layers, are not shown for visualization purposes. In the illustrated embodiment, a core via 156 extends between the first package 152 and the second package 154. The core via 156 may be connected to a first pad 158 at the first package 152, and a first microvia 160 may be connected to the first pad 158. The first microvia 160 may extend through multiple layers 162 of the first package 152. For example, the first microvia 160 may extend to a first layer 162A (e.g., a top layer), and a trace 164 routed along the first layer 162A may be connected to the first microvia 160. Thus, the core via 156, the first pad 158, the first microvia 160, and the trace 164 may be electrically coupled to one another. For instance, the trace 164 may be electrically coupled to another component of the first layer 162A to enable signal transmission between the component and the core via 156. Additionally, the core via 156 may be connected to a second pad 166 at the second package 154, and a second microvia 168 may be connected to the second pad 166. The second microvia 168 may extend through multiple layers 170 of the second package 154. For instance, the second microvia 168 may extend to a second layer (e.g., a bottom layer) to connect to an interconnect, which may be connected to a PCB. Thus, the core via 156, the second pad 166, the second microvia 168, and the PCB may be electrically coupled to one another. In this manner, the core via 156 may electrically couple the first package 152 (e.g., a component of the first package 152) to the second package 154 and to the PCB.

The first pad 158, the second pad 166, or both may have an oblong shape to facilitate signal propagation, such as by reducing impedance discontinuities. For example, in some embodiments, manufacture of the core via 156 may be restricted or limited. In other words, manufacture of the core via 156 may not be easily adjustable, such as to change an impedance of the core via 156 (e.g., toward an impedance of a particular embodiment of a pad). The impedance of the core via 156 may be based on various parameters of the core via 156, such as a material, a dimension (e.g., a length extending between the packages 152, 154, a cross-sectional area of the core via 156), and so forth, which may be further be dependent on other aspects of the IC 150 (e.g., a size of a core region, a data rate transmission), and adjustability of such parameters may be limited by such aspects of the IC 150. However, manufacture of the pads 158, 166, such as a geometric profile of the pads 158, 166, may be adjustable. For this reason, the pads 158, 166 may be manufactured to have specific shapes, such as oblong shapes, that may include impedances that are more similar to (e.g., within a threshold value of) the impedance of the core via 156 being implemented in the IC 100 to improve signal transmission through the IC 100. As an example, for relatively higher data rate transmissions, signal loss for the IC 100 having oblong pads 158, 166 is reduced as compared to signal loss for an IC that uses circular pads for electrically coupling separate packages to one another.

Figure 3:
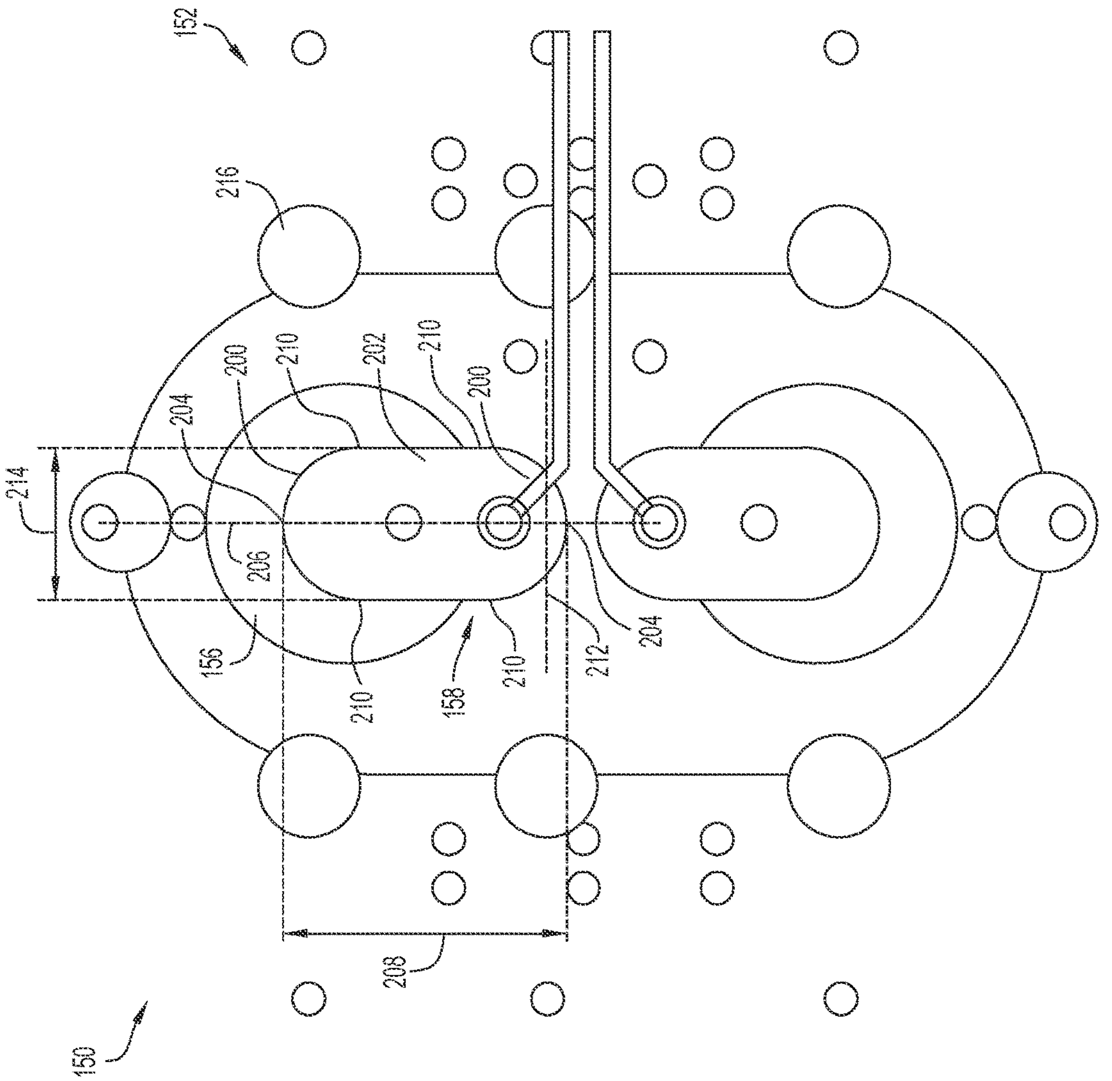
FIG. 3 is a schematic diagram of the IC of FIG. 2, according to an example embodiment.

FIG. 3 is a schematic diagram of the IC 150. In particular, FIG. 3 illustrates an example of the first pad 158 at the first package 152. The first pad 158 includes two arcuate or curved portions 200 positioned at opposite ends of the first pad 158, as well as a linear portion 202 extending between the arcuate portions 200. The arrangement of the arcuate portions 200 relative to the linear portion 202 may define the oblong shape of the first pad 158. For example, each arcuate portion 200 includes a distal end 204 (e.g., a vertex, a peak, a crest), and the distal ends 204 are aligned with a first axis 206 (e.g., a longitudinal axis) and separated from one another to define a first dimension 208 (e.g., a length) of the first pad 158 extending between the respective distal ends 204 of the arcuate portions 200. The linear portion 202 may extend along the first axis 206 between the arcuate portions 200. For instance, each arcuate portion 200 also includes proximal ends 210 positioned at opposite sides of the arcuate portion 200 along a second axis 212 (e.g., a lateral axis), which may be oriented perpendicularly relative to the first axis 206. The linear portion 202 may be connected to the respective proximal ends 210 of the arcuate portions 200. A second dimension 214 (e.g., a width, a diameter) may span between the linear portion 202, and therefore between the proximal ends 210 connected to the linear portion 202, along the second axis 212. The first dimension 208 may be greater than the second dimension 214 to define the oblong shape of the first pad 158. In certain embodiments, each arcuate portion 200 may be circular (e.g., semi-circular). Thus, the second dimension 214 may include a diameter of the acuate portions 200. In additional or alternative embodiments, an arcuate portion 200 may have a different arcuate profile, such as an elliptical shape in which the second dimension 214 may include an axis length (e.g., a major axis length, a minor axis length) of the arcuate portion 200.

The oblong shape of the first pad 158 may cause the first pad 158 to have an impedance that substantially matches (e.g., is within a threshold of) that of the core via 156. For this reason, the oblong shape of the first pad 158 may reduce impedance discontinuity between the first pad 158 and the core via 156, thereby reducing signal loss and improving signal transmission between the first pad 158 and the core via 156. As an example, the similar impedances of the first pad 158 and the core via 156 may reduce resonance and reflection. A specific shape of the first pad 158 may be provided based on a desired impedance of the first pad 158. For example, a particular ratio between the first dimension 208 and the second dimension 214 may be implemented to match the impedance of the first pad 158 with that of the core via 156. Thus, manufacture of the first pad 158 to create a particularly shaped and/or sized first pad 158 may be based on the design of the core via 156.

Stitching vias 216 may additionally be utilized to improve signal integrity. The stitching vias 216 may electrically couple to a ground (e.g., a ground layer) and may be positioned to reduce electric field leakage associated with the first pad 158 and/or with the core via 156. For example, the stitching vias 216 may be arranged to collectively surround the core via 156 and the first pad 158. Such positioning of the stitching vias 216 may help block a signal from being undesirably emitted off the core via 156 and/or off the first pad 158, thereby forcing the signal to propagate along the core via 156 and/or along the first pad 158. As such, the stitching vias 216 may isolate the electric fields to reduce signal loss and facilitate signal transmission along the core via 156 and the first pad 158. In this manner, the stitching vias 216 may further improve signal integrity. The illustrated embodiment includes 8 stitching vias 216 collectively surrounding the first pad 158. However, additional or alternative embodiments may include a different quantity of stitching vias 216 that is above a threshold quantity, such as above 6 stitching vias 216. The stitching vias 216 may also be arranged in any suitable manner, such as equidistant from one another, at different distances from one another, symmetrically about the first pad 158, asymmetrically about the first pad 158, and/or in any other suitable arrangement to isolate the electric fields. The arrangement of the stitching vias 216 may be provided based on a parameter (e.g., a dimension) related to the first pad 158, a parameter (e.g., a dimension) related to the stitching vias 216, a parameter (e.g., a dimension) of the core via 156, a data rate of signal transmission, a routing of traces, a size of the first package 152, a manufacturability, and/or any other suitable parameter.

Figure 4:
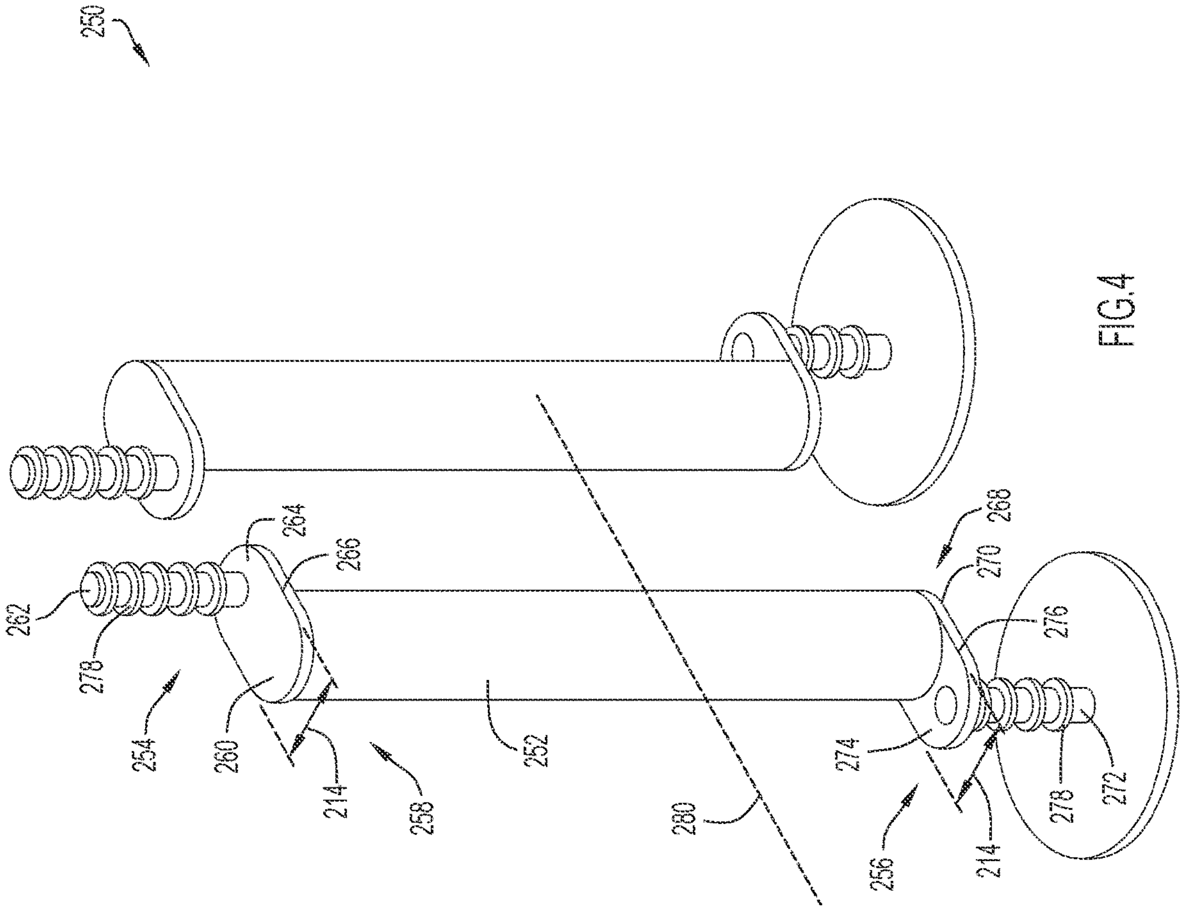
FIG. 4 is a perspective view of a portion of an IC with oblong pads, according to an example embodiment.

FIG. 4 is a perspective view of a portion of an embodiment of an IC 250. Certain components of the IC 250 are not shown for visualization purposes. The IC 250 includes a core via 252 connected to a first pad 254 (e.g., of a first package) and to a second pad 256 (e.g., of a second package). In the illustrated embodiment, a first end 258 of the core via 252 is connected to a first arcuate portion 260 (e.g., having a semi-circular shape) of the first pad 254. Additionally, a first microvia 262 (e.g., extending through the first package) is connected to a second arcuate portion 264 (e.g., having a semi-circular shape) of the first pad 254. The first pad 254 may offset the core via 252 and the first microvia 262 from one another. For instance, the core via 252 is connected to a part of a first linear portion 266 of the first pad 254, and a remainder of the first linear portion 266 may extend the first microvia 262 away from the core via 252. Additionally, a second end 268, opposite the first end 258, of the core via 252 is connected to a third arcuate portion 270 (e.g., having a semi-circular shape) of the second pad 256, and a second microvia 272 (e.g., extending through the second package) is connected to a fourth arcuate portion 274 (e.g., having a semi-circular shape) of the second pad 256. For example, the core via 252 is connected to a part of a second linear portion 276 of the second pad 256, and a remainder of the second linear portion 276 may extend the second microvia 272 away from the core via 252, thereby offsetting the core via 252 and the second microvia 272 from one another. Each of the microvias 262, 272 may further be connected to microvia pads 278 within each package (e.g., at different layers of the package). The microvia pads 278 may, for instance, electrically couple the microvias 262, 272 to other components (e.g., traces) of the respective package, such as at different layers within each package. The microvia pads 278 have a circular shape in the illustrated embodiment, but additional or alternative microvia pads 278 may have any suitable configuration (e.g., to match an impedance of the microvia pads 278 with that of the microvias 262, 272).

In the illustrated embodiment, a diameter of the core via 252 substantially matches the second dimension 214 of the pads 254, 256. Additionally, the core via 252 may be concentrically aligned with the first arcuate portion 260 of the first pad 254 and with the third arcuate portion 270 of the second pad 256. As a result, a portion (e.g., a portion of the perimeter, a portion of the circumference) of the first end 258 of the core via 252 may extend alongside (e.g., conform to) an outer boundary of the first arcuate portion 260 of the first pad 254, and a portion (e.g., a portion of the perimeter, a portion of the circumference) of the second end 268 of the core via 252 may extend alongside (e.g., conform to) an outer boundary of the third arcuate portion 270 of the second pad 256. The concentric alignment of the core via 252 with the first arcuate portion 260 and with the third arcuate portion 270 may also cause the first arcuate portion 260 and the third arcuate portion 270 to concentrically align with one another. Moreover, the first microvia 262 may be concentrically aligned with the second arcuate portion 264 of the first pad 254, and the second microvia 272 may be concentrically aligned with the fourth arcuate portion 274 of the second pad 256. However, the diameter of each microvia 262, 272 may be substantially smaller than the second dimension 214. Thus, the second arcuate portion 264 may extend outwardly (e.g., radially) beyond the first microvia 262, and the fourth arcuate portion 274 may extend outwardly (e.g., radially) beyond the second microvia 272. As such, a perimeter of the first microvia 262 is enclosed within the outer boundary of the first pad 254, and a perimeter of the second microvia 272 is enclosed within the outer boundary of the second pad 256.

The first pad 254 and the second pad 256 may generally be oriented in the same direction. For example, the second dimension 214 of the first pad 254 and the second dimension 214 of the second pad 256 may extend parallel to one another. However, the first pad 254 and the second pad 256 may extend from the core via 252 in opposite directions. Thus, even though the first pad 254 and the second pad 256 at least partially overlap with one another along an axis 280 (e.g., the first axis 206), the second arcuate portion 264 of the first pad 254 and the fourth arcuate portion 274 of the second pad 256 may be offset from one another along the axis 280. In this manner, the core via 252, the first pad 254, and the second pad 256 may cooperatively form a Z-shaped configuration.

Figure 5:
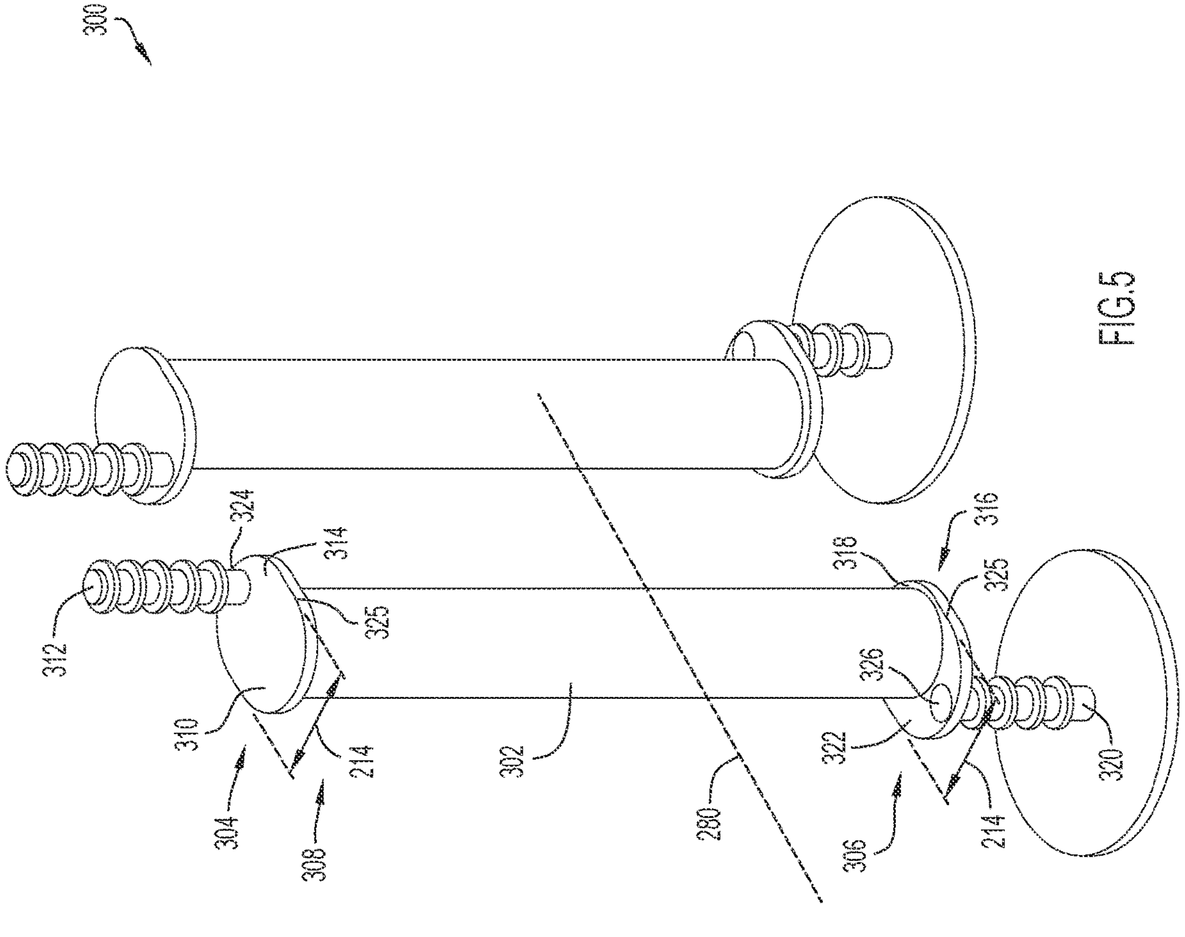
FIG. 5 is a perspective view of a portion of an IC with oblong pads, according to another example embodiment.

FIG. 5 is a perspective view of a portion of an embodiment of an IC 300. Certain components of the IC 300 are not shown for visualization purposes. The IC 300 includes a core via 302 connected to a first pad 304 and to a second pad 306. For example, a first end 308 of the core via 302 may be connected to a first arcuate portion 310 (e.g., having a semi-circular shape) of the first pad 304, and a first microvia 312 may be connected to a second arcuate portion 314 (e.g., having a semi-circular shape) of the first pad 304. Additionally, a second end 316 of the core via 302 may be connected to a third arcuate portion 318 (e.g., having a semi-circular shape) of the second pad 306, and a second microvia 320 may be connected to a fourth arcuate portion 322 (e.g., having a semi-circular shape) of the second pad 306. A diameter of the core via 252 may be less than the second dimension 214 of the pads 304, 306. For this reason, the pads 304, 306 (e.g., the first arcuate portion 310 of the first pad 304, the third arcuate portion 318 of the 306) may extend outwardly (e.g., radially) beyond the core via 302. Thus, a perimeter of the core via 302 is enclosed within the outer boundary of the pads 304, 306.

The first pad 304 and the second pad 306 may include respective linear portions 325 extending between the first arcuate portion 310 and the second arcuate portion 314 or between third arcuate portion 318 and the fourth arcuate portion 322. For example, the first end 308 of the core via 302 may also be connected to the linear portion 325 of the first pad 304, and the second end 316 of the core via 302 may be connected to the linear portion 325 of the second pad 306. In some embodiments, the linear portions 325 of the first pad 304 and of the second pad 306 may be smaller (e.g., shorter) than the first linear portion 266 of the first pad 254 and/or than the second linear portion 276 of the second pad 256.

The core via 302 may be offset from the first microvia 312 and from the second microvia 320 along the axis 280. By way of example, the first microvia 312 may be positioned in contact with a first distal end 324 of the second arcuate portion 314 of the first pad 304 to position the first microvia 312 away from the core via 302, and the second microvia 320 may be positioned in contact with a second distal end 326 of the fourth arcuate portion 322 of the second pad 306 to position the second microvia 320 away from the core via 302. However, the first microvia 312 may not extend beyond the first distal end 324, and the second microvia 320 may not extend beyond the second distal end 326. Thus, the microvias 312, 320 are contained within the respective outer boundaries of the pads 304, 306.

Figure 6:
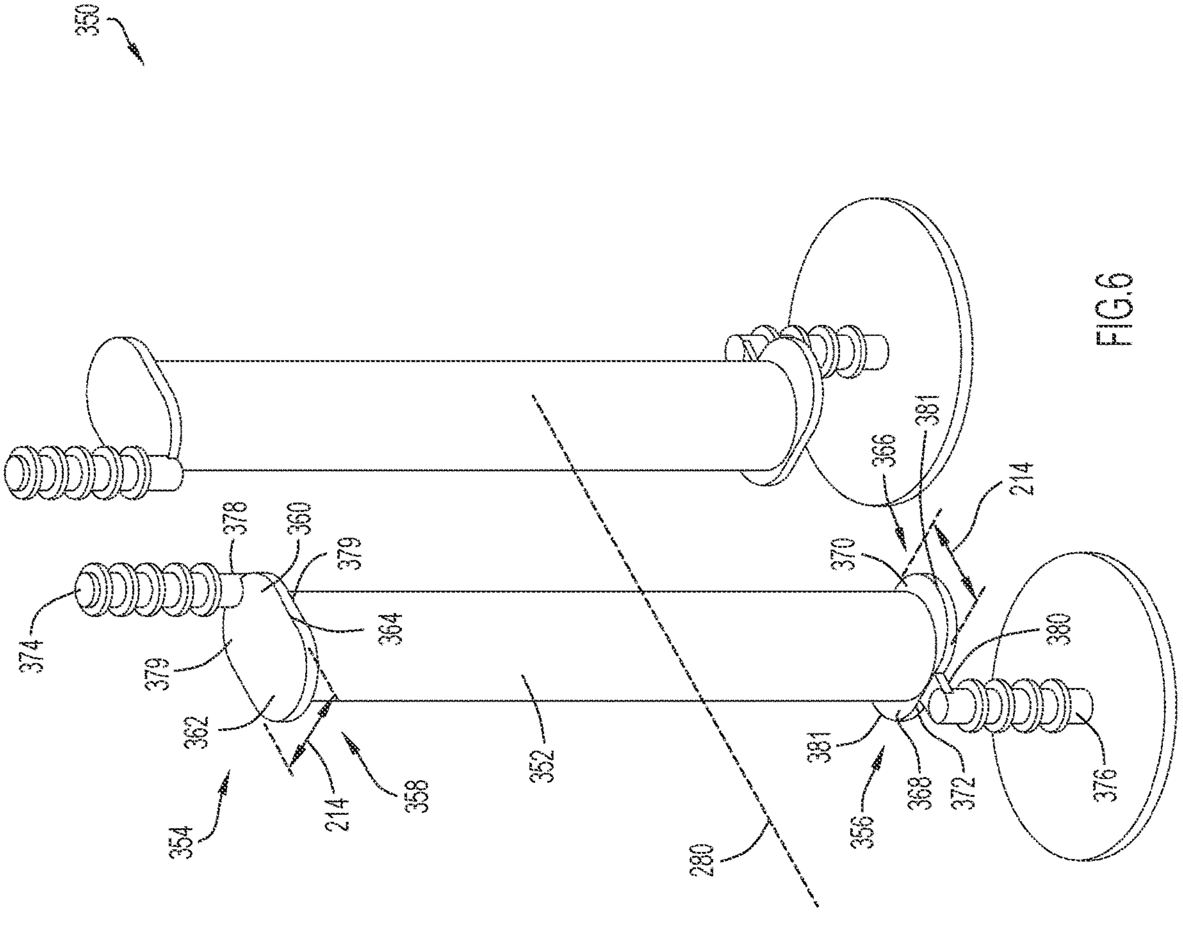
FIG. 6 is a perspective view of a portion of an IC with oblong pads, according to yet another example embodiment.

FIG. 6 is a perspective view of a portion of an embodiment of an IC 350. Certain components of the IC 350 are not shown for visualization purposes. The IC 350 includes a core via 352 connected to a first pad 354 and to a second pad 356. By way of example, a first end 358 of the core via 352 may be connected to a first arcuate portion 360 (e.g., having a semi-circular shape), a second arcuate portion 362 (e.g., having a semi-circular shape), and a first linear portion 364 of the first pad 354. For instance, the core via 352 may be centered between the first arcuate portion 360 and the second arcuate portion 362 at the first linear portion 364. Additionally, a second end 366 of the core via 352 may be connected to a third arcuate portion 368 (e.g., having a semi-circular shape), a fourth arcuate portion 370 (e.g., having a semi-circular shape), and a second linear portion 372 of the second pad 356. For example, the core via 352 may be centered between the third arcuate portion 368 and the fourth arcuate portion 370 at the second linear portion 372.

The pads 354, 356 may be oriented in different directions from one another. For example, the second dimension 214 of the first pad 354 may extend crosswise (e.g., perpendicularly) to the second dimension 214 of the second pad 356. Moreover, a first microvia 374 may be electrically coupled to the first pad 354 and offset from the core via 352 along the axis 280, and a second microvia 376 may be electrically coupled to the second pad 356 and offset from the core via 352 along the axis 280. To this end, the first microvia 374 may be connected to a distal end 378 of the first arcuate portion 360 of the first pad 354 to position the first microvia 374 away from the core via 352 partially connected to the first arcuate portion 360 (e.g., to proximate ends 379 of the first arcuate portion 360). For example, the first microvia 374 may extend partially beyond the distal end 378 to be positioned offset from the core via 352. In addition, the second microvia 376 may be offset from the second pad 356 to position the second microvia 376 away from the core via 352 connected to the second pad 356. A connection pad 380 may be connected to the second microvia 376 and the second pad 356 to electrically couple the second microvia 376 and the second pad 356 to one another. In the illustrated embodiment, the connection pad 380 is connected to the second linear portion 372 of the second pad 356. However, in additional or alternative embodiments, the connection pad 380 may be connected to another part of the second pad 356, such as the third arcuate portion 368 or the fourth arcuate portion 370. In further embodiments, the second microvia 376 may be directly connected to the second pad 356 and still be offset from the core via 352. As an example, the second microvia 376 may be connected to the third arcuate portion 368 and/or to the fourth arcuate portion 370, such as to one of the distal ends 381 of the second pad 356.

It should be noted that any combination or permutation of the illustrated oblong pads may be arranged to couple to a core via. For example, oblong pads that are oriented in any suitable manner (e.g., extend in the same direction or in different directions), having any suitable dimension (e.g., having the second dimension 214 that matches or does not match a diameter of the core via), coupled to the core via in any suitable manner (e.g., at an arcuate portion, at a linear portion), and/or coupled to microvias (e.g., directly, using a connection pad, at an arcuate portion, at a linear portion) may be utilized. The particular arrangement of the oblong pads may be based on the impedance of the core via (e.g., to match the respective impedances of the oblong pads and of the core via to one another), a manufacturability, a routing of traces, a size of the package (e.g., a distance between packages), or any other suitable aspect. Furthermore, although each of FIGS. 4-6 illustrates a core via connected to two oblong pads, it should be noted that in additional or alternative embodiments, one of the pads connected to the core via may not be oblong. As an example, a first end of the core via may be connected to an oblong pad, and a second end of the core via may be connected to a circular pad. Further still, in some embodiments, a microvia may be positioned in alignment (e.g., in concentric alignment) or in overlap with a core via. That is, the microvia may not be offset from the core via.

Figure 7:
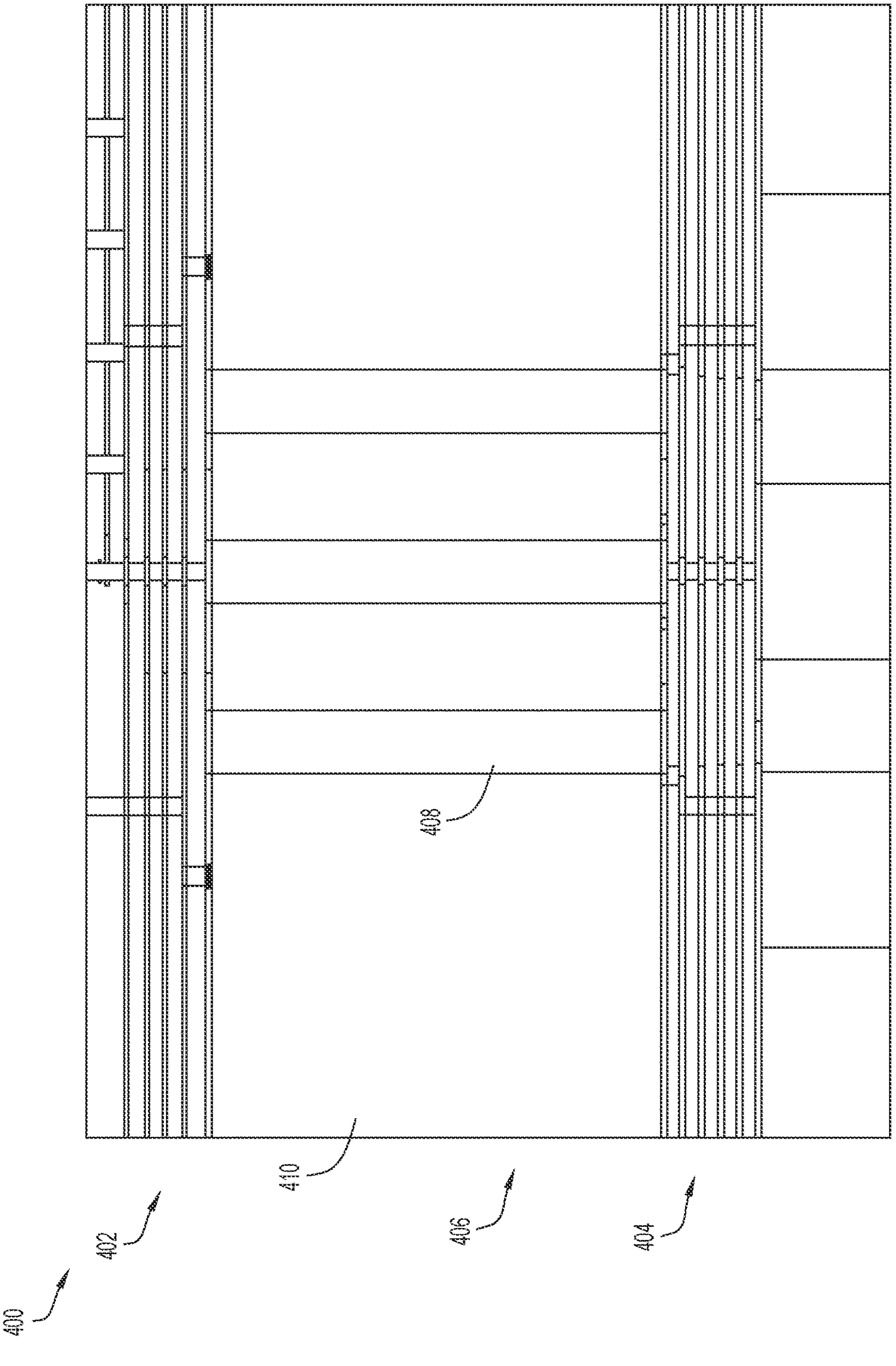
FIG. 7 is a cross-sectional view of an IC, according to an example embodiment.

FIG. 7 is a cross-sectional view of an embodiment of an IC 400. The IC 400 includes a first package 402 and a second package 404 offset from one another to form a core region 406 between the first package 402 and the second package 404. Core vias 408 extend within the core region 406 to electrically couple the packages 402, 404 to one another. For example, the core vias 408 may be connected to respective pads (not shown) of the packages 402, 404. The pads may be oblong to match the impedance of the pads with the impedance of the core vias 408 to improve signal transmission between the packages 402, 404.

In some embodiments, a dielectric material 410 (e.g., a substrate, a core material) may be positioned in the core region 406 to support the packages 402, 404 and block undesirable electrical coupling between the packages 402, 404. The dielectric material 410 may affect or adjust impedance of the core via 408. For example, the effect of the dielectric material 410 on the impedance of the core via 408 may be based on certain electrical properties, such as capacitance, of the dielectric material 410. For this reason, a particular dielectric material 410 may be selected and implemented such that the adjusted impedance of the core via 408 is similar to the impedance of the pads connected to the core via 408. As an example, a dielectric material 410 having a relatively low dielectric constant, such as a dielectric constant below a threshold value (e.g., a value between 1.5 and 3), and therefore a relatively low capacitance, may be selected and positioned within the core region 406. For instance, the dielectric material 410 having a relatively low dielectric constant may reduce parasitic capacitance between the pads electrically coupled to the core vias 408. The parasitic capacitance may otherwise increase the capacitance (e.g., beyond the capacitance already provided by the core vias 408) and cause reduced impedance within the core region 406. Thus, the dielectric material 410 having the relatively low dielectric constant may additionally help reduce impedance discontinuities between the core vias 408 and the pads by further limiting capacitance increase within the core region 406 to improve signal transmission. Moreover, the dielectric material 410 may change the resonance resulting from signal transmission to improve signal transmission. For example, resonance that matches the fundamental frequency of signal transmission may negatively affect operations to transmit signals of a desirable signal integrity. However, the low dielectric constant of the dielectric material 410 may push the resonance beyond the fundamental frequency of the IC, thereby improving operations to transmit signals. That is, the dielectric material 410 may reduce resonances that match the fundamental frequency of signal transmission to improve signal integrity.

Figure 8:
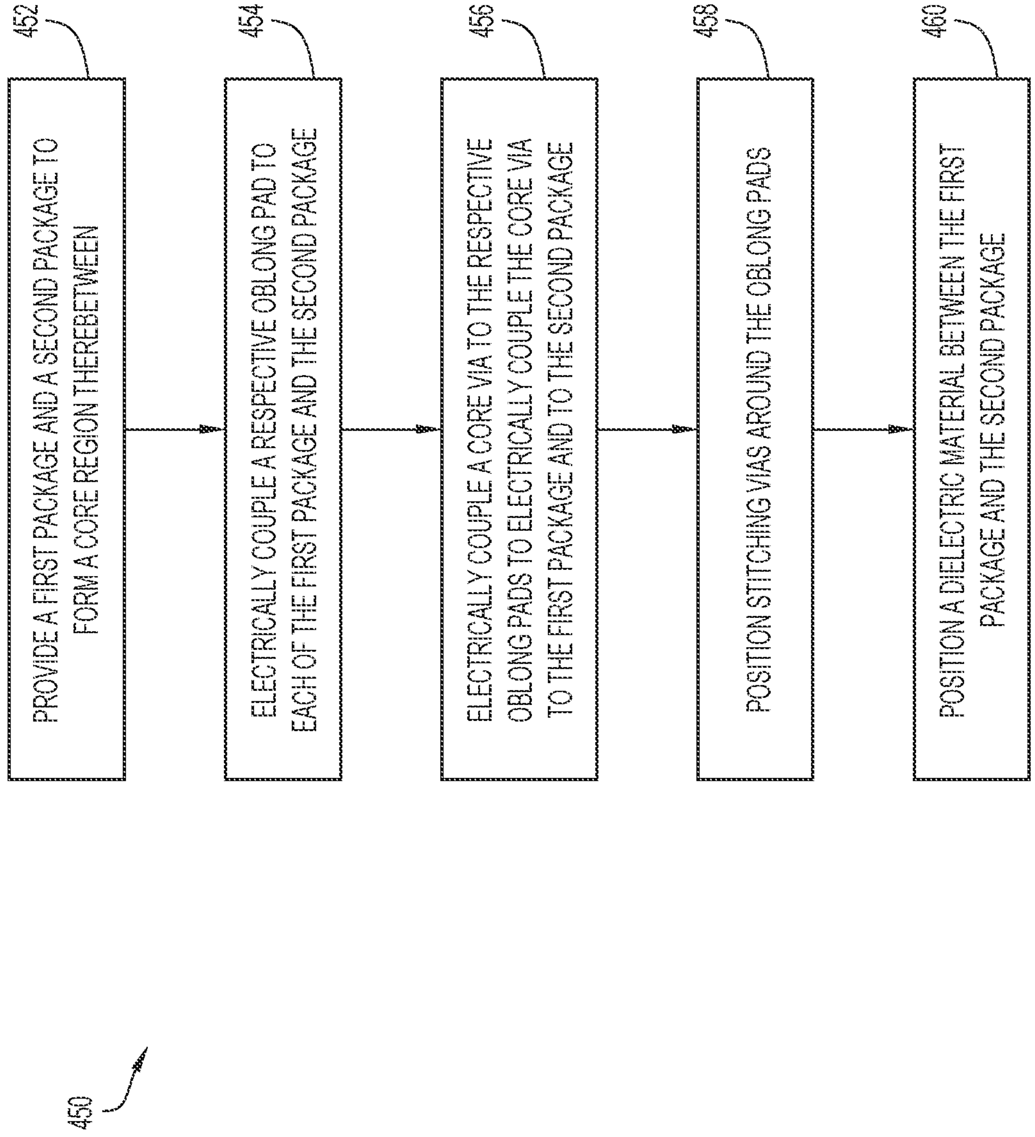
FIG. 8 is a flowchart of a method of manufacture of an IC, according to an example embodiment.

FIG. 8 is a flowchart of an embodiment of a method 450 of manufacture of an IC, such as any of the ICs 100, 150, 250, 300, 350, 400 discussed herein. In certain embodiments, the method 450 may be performed automatically, such as by a processor executing instructions stored on a memory. In additional or alternative embodiments, the method 450 may be performed manually, such as by an operator. It should be noted that the method 450 may be performed differently than depicted. For example, additional operations may be performed, any of the depicted operations may not be performed, and/or any of the depicted operations may be performed in a different order.

At step 452, a first package and a second package are provided. For example, each of the first package and the second package may include respective layers, such as a signal layer (e.g., along which a signal may be transmitted between electronic components), a ground layer (e.g., providing a return path for current flow), and/or a power layer (e.g., from which a signal may originate). In some embodiments, one of the packages may include a logic package configured to process a signal, and the other of the packages may include a BGA package configured to couple to a PCB. The first package and the second package may be offset from one another to form a core region therebetween.

At step 454, respective oblong pads may be electrically coupled to the first package and to the second package. By way of example, a first oblong pad may be connected to a first layer of the first package, the first layer being exposed to and facing the core region. A second oblong pad may be connected to a second layer of the second package, the second layer being exposed to and facing the core region. Each oblong pad may include arcuate portions that are connected to a linear portion. The oblong pads may be oriented in any suitable manner, such as extending along the same direction or in different directions. The arrangement, shape, and/or size of the oblong pads may be selected based on certain parameters, such as a resulting impedance of the configuration of the oblong pads, a routing of traces of the packages, and/or a manufacturability.

Additionally, each oblong pad may be electrically coupled to microvias that extend through layers within one of the packages. In some embodiments, one of the oblong pads, such as an arcuate portion of the oblong pad, is directly connected to a microvia to electrically couple the oblong pad and the microvia to one another. In additional or alternative embodiments, a connection pad connects to the microvia and to one of the oblong pads to electrically couple the oblong pad and the microvia to one another.

At step 456, a core via may be electrically coupled to each oblong pad to electrically couple the core via to the first package and to the second package. That is, the core via may be positioned within the core region to extend between the first package and the second package. For example, a first end of the core via may be connected to the first oblong pad, and a second end of the core via may be connected to the second oblong pad. The configuration and arrangement of the core via and of the oblong pads may cause the impedance of the core via to substantially match (e.g., be within a threshold of) the impedance of the oblong pads. As an example, the shape of the oblong pads, such as a diameter of the arcuate portions and/or a distance between distal ends of the arcuate portions, may cause the impedance of the oblong pads to match that of the core via (e.g., a core via particularly sized to extend between the packages). Thus, an impedance discontinuity between the oblong pads and the core via may be limited to improve signal transmission.

At step 458, stitching vias may be positioned at the packages. By way of example, respective stitching vias may be arranged to collectively surround the oblong pads to isolate an electric field originating from the oblong pads and/or from the core via. In this way, the stitching vias facilitate signal transmission along the oblong pad and along the core via. A respective quantity of stitching vias positioned at each package may exceed a threshold quantity, such as 6, 7, or 8 stitching vias, to sufficiently isolate electric fields.

At step 460, a dielectric material is positioned between the first package and the second package within the core region. The dielectric material may be selected based on the dielectric material having a particular electrical property. For instance, the dielectric constant of the dielectric material may affect the impedance of the core via. Thus, the dielectric material may be selected based on its dielectric constant such that the impedance of the core via remains similar to the impedance of the oblong pads. As an example, the dielectric constant of the dielectric material may be below a threshold, such as a value between 1.5 and 3. Consequently, selection of the dielectric material may further help reduce impedance discontinuities between the oblong pads and the core to improve signal transmission.

The techniques discussed herein provide an IC with reduced impedance discontinuities to improve signal transmission operations, such as at higher data rate transmissions. For example, the IC may include a first package and a second package that are separate from one another. A core via may extend between the packages, and pads may be used to electrically couple the core via to the packages. The pads may have an oblong shape to match their impedances to that of the core via. Additionally, a dielectric material having a sufficiently low dielectric constant may be positioned between the packages. The low dielectric constant of the dielectric material may adjust the impedance of the core via, such as to facilitate matching with the impedance of the pads. Moreover, the dielectric material may block resonances that match the fundamental frequency related to signal transmissions from occurring, further improving operations to transmit signals.

In some aspects, the techniques described herein relate to an apparatus, including: a plurality of packages of an integrated circuit (IC); a core via extending between a first package of the plurality of packages and a second package of the plurality of packages; and a pad electrically coupling the core via to the first package, wherein the pad includes an oblong shape.

In some aspects, the techniques described herein relate to an apparatus, including an additional pad electrically coupling the core via to the second package.

In some aspects, the techniques described herein relate to an apparatus, wherein the additional pad includes another oblong shape.

In some aspects, the techniques described herein relate to an apparatus, including a dielectric material positioned between the first package and the second package, wherein the dielectric material includes a dielectric constant that is below a threshold value.

In some aspects, the techniques described herein relate to an apparatus, wherein the threshold value is between 1.5 and 3.

In some aspects, the techniques described herein relate to an apparatus, wherein the pad includes two arcuate portions and a linear portion extending between the two arcuate portions to form the oblong shape.

In some aspects, the techniques described herein relate to an apparatus, wherein one of the arcuate portions includes a first diameter, the core via includes a second diameter, and the first diameter and the second diameter match one another.

In some aspects, the techniques described herein relate to an apparatus, wherein the core via is concentric to the arcuate portion including the first diameter.

In some aspects, the techniques described herein relate to an apparatus, wherein the first package includes a plurality of layers and a microvia extending through the plurality of layers, and the microvia is coupled to one of the arcuate portions.

In some aspects, the techniques described herein relate to an apparatus, wherein the core via includes a first diameter and is coupled to one of the arcuate portions that includes a second diameter, greater than the first diameter such that the arcuate portion extends radially beyond the core via.

In some aspects, the techniques described herein relate to an apparatus, wherein the first package includes a plurality of layers and a microvia extending through the plurality of layers, the microvia is offset from the pad, and the IC includes a connection pad that is connected to the microvia and to the pad to electrically couple the microvia and the pad to one another.

In some aspects, the techniques described herein relate to an apparatus, wherein the first package includes a plurality of stitching vias positioned around the pad, and a quantity of the plurality of stitching vias is greater than a threshold quantity.

In some aspects, the techniques described herein relate to a method, including: positioning a core via between a first package of an integrated circuit (IC) and a second package of the IC; and electrically coupling the core via to an oblong pad of the first package to electrically couple the core via to the first package.

In some aspects, the techniques described herein relate to a method, including electrically coupling the core via to an additional oblong pad of the second package to electrically couple the core via to the second package.

In some aspects, the techniques described herein relate to a method, including positioning a dielectric material between the first package and the second package, wherein the dielectric material includes a dielectric constant that is below 3.

In some aspects, the techniques described herein relate to a method, wherein the oblong pad is positioned at a layer of the first package, the method includes positioning a plurality of stitching vias at the layer and around the oblong pad, and a quantity of the plurality of stitching vias is greater than six.

In some aspects, the techniques described herein relate to an apparatus, including: a first pad of a first package of an integrated circuit (IC); a second pad of a second package of the IC; and a core via having a first end connected to the first pad and a second end connected to the second pad to electrically couple to the first package and to the second package, wherein at least one of the first pad and the second pad is oblong.

In some aspects, the techniques described herein relate to an apparatus, wherein each of the first pad and the second pad is oblong.

In some aspects, the techniques described herein relate to an apparatus, wherein the first pad and the second pad extend from the core via in opposite directions.

In some aspects, the techniques described herein relate to an apparatus, wherein the first pad and the second pad are oriented crosswise with respect to one another.

The above description is intended by way of example only. Although the techniques are illustrated and described herein as embodied in one or more specific examples, it is nevertheless not intended to be limited to the details shown, since various modifications and structural changes may be made within the scope and range of equivalents of the claims.

As used herein, unless expressly stated to the contrary, use of the phrase ‘at least one of’, ‘one or more of’, ‘and/or’, variations thereof, or the like are open-ended expressions that are both conjunctive and disjunctive in operation for any and all possible combination of the associated listed items. For example, each of the expressions 'at least one of X, Y and Z', 'at least one of X, Y or Z', 'one or more of X, Y and Z', 'one or more of X, Y or Z' and 'X, Y and/or Z' can mean any of the following: 1) X, but not Y and not Z; 2) Y, but not X and not Z; 3) Z, but not X and not Y; 4) X and Y, but not Z; 5) X and Z, but not Y; 6) Y and Z, but not X; or 7) X, Y, and Z.

Note that in this Specification, references to various features (e.g., elements, structures, nodes, modules, components, engines, logic, steps, operations, functions, characteristics, etc.) included in 'one embodiment', 'example embodiment', 'an embodiment', 'another embodiment', 'certain embodiments', 'some embodiments', 'various embodiments', 'other embodiments', 'alternative embodiment', and the like are intended to mean that any such features are included in one or more embodiments of the present disclosure, but may or may not necessarily be combined in the same embodiments.

Each example embodiment disclosed herein has been included to present one or more different features. However, all disclosed example embodiments are designed to work together as part of a single larger system or method. This disclosure explicitly envisions compound embodiments that combine multiple previously-discussed features in different example embodiments into a single system or method.

Additionally, unless expressly stated to the contrary, the terms 'first', 'second', 'third', etc., are intended to distinguish the particular nouns they modify (e.g., element, condition, node, module, activity, operation, etc.). Unless expressly stated to the contrary, the use of these terms is not intended to indicate any type of order, rank, importance, temporal sequence, or hierarchy of the modified noun. For example, 'first X' and 'second X' are intended to designate two 'X' elements that are not necessarily limited by any order, rank, importance, temporal sequence, or hierarchy of the two elements. Further as referred to herein, 'at least one of' and 'one or more of' can be represented using the '(s)' nomenclature (e.g., one or more element(s)).

As used herein, the terms "approximately," "generally," "substantially," and so forth, are intended to convey that the property value being described may be within a relatively small range of the property value, as those of ordinary skill would understand. For example, when a property value is described as being "approximately" equal to (or, for example, "substantially similar" to) a given value, this is intended to convey that the property value may be within +/−5%, within +/−4%, within +/−3%, within +/−2%, within +/−1%, or even closer, of the given value. Similarly, when a given feature is described as being "substantially parallel" to another feature, "generally perpendicular" to another feature, and so forth, this is intended to convey that the given feature is within +/−5%, within +/−4%, within +/−3%, within +/−2%, within +/−1%, or even closer, to having the described nature, such as being parallel to another feature, being perpendicular to another feature, and so forth. Mathematical terms, such as "parallel" and "perpendicular," should not be rigidly interpreted in a strict mathematical sense, but should instead be interpreted as one of ordinary skill in the art would interpret such terms. For example, one of ordinary skill in the art would understand that two lines that are substantially parallel to each other are parallel to a substantial degree, but may have minor deviation from exactly parallel.

The techniques presented and claimed herein are referenced and applied to material objects and concrete examples of a practical nature that demonstrably improve the present technical field and, as such, are not abstract, intangible, or purely theoretical. Further, if any claims appended to the end of this specification contain one or more elements designated as "means for [perform]ing [a function] . . . or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

One or more advantages described herein are not meant to suggest that any one of the embodiments described herein necessarily provides all of the described advantages or that all the embodiments of the present disclosure necessarily provide any one of the described advantages. Numerous other changes, substitutions, variations, alterations, and/or modifications may be ascertained to one skilled in the art and it is intended that the present disclosure encompass all such changes, substitutions, variations, alterations, and/or modifications as falling within the scope of the appended claims.

What is claimed is:

1. An apparatus comprising:

a plurality of packages of an integrated circuit (IC);

a core via extending between a first package of the plurality of packages and a second package of the plurality of packages; and a pad electrically coupling the core via to the first package, wherein the pad comprises two arcuate portions and a linear portion extending between the two arcuate portions to form an oblong shape.

2. The apparatus of claim 1, comprising an additional pad electrically coupling the core via to the second package.

3. The apparatus of claim 2, wherein the additional pad comprises another oblong shape.

4. The apparatus of claim 3, wherein the pad and the additional pad extend from the core via in opposite directions.

5. The apparatus of claim 3, wherein the pad and the additional pad are oriented crosswise with respect to one another.

6. The apparatus of claim 1, comprising a dielectric material positioned between the first package and the second package, wherein the dielectric material comprises a dielectric constant that is below a threshold value.

7. The apparatus of claim 6, wherein the threshold value is between 1.5 and 3.

8. The apparatus of claim 1, wherein one of the two arcuate portions comprises a first diameter, the core via comprises a second diameter, and the first diameter and the second diameter match one another.

9. The apparatus of claim 8, wherein the core via is concentric to the arcuate portion comprising the first diameter.

10. The apparatus of claim 1, wherein the first package comprises a plurality of layers and a microvia extending through the plurality of layers, and the microvia is coupled to one of the two arcuate portions.

11. The apparatus of claim 1, wherein the core via comprises a first diameter and is coupled to one of the two arcuate portions that comprises a second diameter, greater than the first diameter of the core via such that the arcuate portion comprising the second diameter extends radially beyond the core via.

12. The apparatus of claim 1, wherein the first package comprises a plurality of stitching vias positioned around the pad, and a quantity of the plurality of stitching vias is greater than a threshold quantity.

13. An apparatus comprising:

a first pad of a first package of an integrated circuit (IC);

a second pad of a second package of the IC; and a core via having a first end connected to the first pad and a second end connected to the second pad to electrically couple to the first package and to the second package, wherein at least one of the first pad and the second pad is oblong, and the first package comprises a plurality of stitching vias positioned around the first pad, and a quantity of the plurality of stitching vias is greater than a threshold quantity.

14. The apparatus of claim 13, wherein each of the first pad and the second pad is oblong.

15. The apparatus of claim 14, wherein the first pad and the second pad extend from the core via in opposite directions.

16. The apparatus of claim 14, wherein the first pad and the second pad are oriented crosswise with respect to one another.

17. The apparatus of claim 13, further comprising a dielectric material positioned between the first package and the second package of the IC, wherein the dielectric material comprises a dielectric constant that is below 3.

18. An apparatus comprising:

a plurality of packages of an integrated circuit (IC);

a core via extending between a first package of the plurality of packages and a second package of the plurality of packages; and a pad electrically coupling the core via to the first package, wherein the pad comprises an oblong shape, wherein the first package comprises a plurality of layers and a microvia extending through the plurality of layers, the microvia is offset from the pad, and the IC comprises a connection pad that is connected to the microvia and to the pad to electrically couple the microvia and the pad to one another.

19. The apparatus of claim 18, wherein the pad comprises two arcuate portions and a linear portion extending between the two arcuate portions to form the oblong shape.

20. The apparatus of claim 18, wherein the first package comprises a plurality of stitching vias positioned around the pad, and a quantity of the plurality of stitching vias is greater than six.

* * * * *